(12) United States Patent
Chen

(10) Patent No.: US 7,150,960 B2
(45) Date of Patent: Dec. 19, 2006

(54) DEVELOPER COMPOSITION

(75) Inventor: Chi-Sheng Chen, Sanchung (TW)

(73) Assignee: Everlight USA, Inc., Pineville, NC (US)

( * ) Notice: Subject to any disclaimer, the term of this patent is extended or adjusted under 35 U.S.C. 154(b) by 0 days.

(21) Appl. No.: 11/201,255

(22) Filed: Aug. 11, 2005

(65) Prior Publication Data

US 2006/0166147 A1 Jul. 27, 2006

(30) Foreign Application Priority Data

Jan. 27, 2005 (CN) .................... 2005 1 0062579

(51) Int. Cl.
*G03C 7/32* (2006.01)
(52) U.S. Cl. .................. 430/311; 430/493; 510/175
(58) Field of Classification Search ........... 430/331, 430/493; 510/175
See application file for complete search history.

(56) References Cited

U.S. PATENT DOCUMENTS

2003/0186174 A1* 10/2003 Nagase .................. 430/325

FOREIGN PATENT DOCUMENTS

| JP | 05-088377 | 4/1993 |
| JP | 07-120935 | 5/1995 |
| JP | 09-034128 | 2/1997 |
| JP | 10-213908 | 8/1998 |

* cited by examiner

*Primary Examiner*—Hoa Van Le
(74) *Attorney, Agent, or Firm*—Bacon & Thomas

(57) ABSTRACT

The present invention relates to a developer composition comprising (a) alkali metal carbonate salt; (b) alkali metal bicarbonate salt; (c) nonionic surfactant of the following formula (I):

(I)

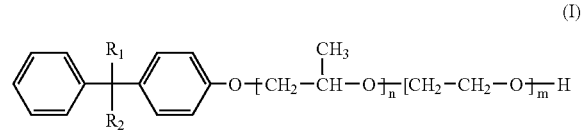

wherein, $R_1$, $R_2$, n, and m are define the same as the specification; and (d) nonionic surfactant of the following formula (II):

(II)

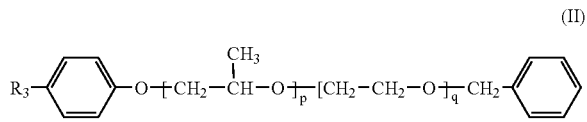

wherein, $R_3$, p, and q are define the same as the specification. The present invention also relates to a developer.

9 Claims, No Drawings

DEVELOPER COMPOSITION

BACKGROUND OF THE INVENTION

1. Field of the Invention

The present invention relates to a developer composition. The present invention also relates to a developer.

2. Description of the Related Prior Art

Fabrication of the integrated circuits, print circuit boards, and liquid crystal displays with subtle pattern often involved coating a photoresist or a radiation sensitive resin composition on an article to be processed, and then patterning the coating film by radiation. Thereafter with an alkaline developer the article is developed to remove unwanted coatings for superb patterns.

Typical used methods for developing including immersion development, shaking development, spraying development and puddle development. Generally the photoresist is prepared by using together alkali-soluble resins such as novolac, acrylic polymers, and poly para-hydroxy styrene with different radiation sensitive matters to obtain a positive or a negative photoresist, and by radiating, the solubility is altered and allows the photoresist to be dissolved in the alkaline developer. Alkaline materials such as sodium hydroxide, potassium hydroxide, sodium carbonate, sodium bicarbonate, tetra-methyl ammonium hydroxide or alkanolamine are widely used in developers.

According to the conventional developing technology, after the photoresist is coated, heated and exposed, an alkaline developer is dissolved with to remove the unwanted unexposed coated region of film, photoresist having acidic functional groups are responsible for the developed shadows. The acid group of the organic polymer will be neutralized in an alkaline solution to form a water soluble organic polymeric salt. When the dissolving photoresist accumulates in the solution, insoluble organic materials are formed in the developing tank, and water insoluble residues and scum are obtained in the end. Developing along with these sediments, undeveloped partial particles or insoluble residues has a higher tendency to form and resulting in imprecise photoresist pattern. To improve the flaws of the aforementioned, surfactants are added to reduce the likelihood for scum formations. As the Japanese Patent application Laid-open No. 7-120935 and Laid-open No. 9-34128 already disclosed, where phenol or nonylphenol of the ethylene oxide nonionic surfactants have the capability of reducing scums. Furthermore, other benefits from adding surfactants including enhancing the adjust development efficiency and increasing production throughput.

With the home use flat screen displays becoming more common to life in recent years, the photo-resist for color filter of the liquid crystal display is added with additives such as dispersed dyes, pigments, cross-linking agents, photo initiators, or unsaturated multi functional monomers and etc for improving the color contrast and saturation, or the adhesive property of the photoresist film, or the mechanical toughness of color filter, or reducing the exposure dose for hgily throughput and saving energy. Development with the use of developers having single nonionic surfactant is not ideal, particularly with black matrix pattern obtained from black photoresist, where after developed it is more susceptible to scum in the unexposed region film, and may include residues of resins or pigments, and resulted in discoloration and other prohibited flaws.

As developing progresses, scum tends to accumulate and resulting dissolved dye microparticles or other water insoluble residues in the development tank to settle on top of the substrate or photoresist film, and causing scum, surface contaminants and others to remain on color filter.

The aforementioned alkaline developer is more susceptible to absorb carbon dioxide gas in the atmosphere, and the alkaline component is more easily reacted with the acidic functional group to cause the pH of the developer greatly change during the developing process and affect the stability of the developer. In Japanese Patent application Laid-open No. 5-88377 or Laid-open No. 10-213908 disclosed the use of general alkaline matter and its conjugated acid-base pair for allowing alkaline developer to have the pH buffer capability as well reducing the uncontrolled factors in the developing process.

However, the aforementioned materials or methods can not satisfy the stability and resolution of the developer.

SUMMARY OF THE INVENTION

The present invention provides a developer composition and a developer. In the exposure of photoresist pattern or color filter, the developer removes by dissolving the unwanted coated film, while scum, surface contaminants, film residues and others are not created, thereby a developer for the use of photoresist composition that allows clear defined pattern of photoresist pattern or color filter is obtained.

The developer compositions of the present invention comprising:

(a) 0.1 to 10 parts by weight of alkali metal carbonate salt, the amount of said alkali metal carbonate salt is calculated by comparing with 100 parts by weight of water;

(b) 0.1 to 10 parts by weight of alkali metal bicarbonate salt, the amount of said alkali metal bicarbonate salt is calculated by comparing with 100 parts by weight of water;

(c) 0.1 to 20 parts by weight of nonionic surfactant of the formula (I) below:

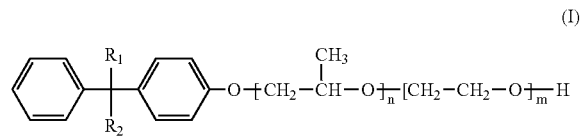

(I)

wherein $R_1$ is hydrogen or methyl; $R_2$ is hydrogen or methyl; n is an integer of 0 to 10; m is an integer of 4 to 20; the amount of said nonionic surfactant of the formula (I) is calculated by comparing with 100 parts by weight of water; and (d) 0.1 to 20 parts by weight of nonionic surfactant of the formula (II) below:

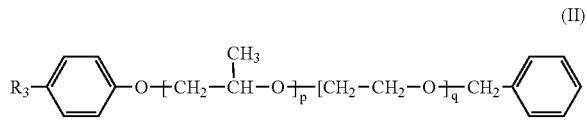

(II)

wherein $R_3$ is $C_1$–$C_{12}$ alkyl; p is an integer of 0 to 10; q is an integer of 4 to 20; the amount of said nonionic surfactant of the formula (II) is calculated by comparing with 100 parts or water.

In the developer composition of the present invention, said n of the formula (I) preferably is an integer of 0 to 5; m is an integer of 6 to 15. The $R_3$ group of the formula (II) preferably is $C_6$–$C_{12}$ alkyl; p preferably is 0 to 5; q preferably is an integer of 6 to 15. More preferably $R_3$ is $C_8$–$C_9$ alkyl.

The alkali metal carbonate salt of the developer composition of the present invention may be exemplified by sodium carbonate, or potassium carbonate. Alkali metal bicarbonate salt may be exemplified by sodium bicarbonate or potassium bicarbonate. It is not restricted to directly prepare with the use of alkali metal carbonate salt and alkali metal bicarbonate salt together or other similar methods. Examples of buffer solutions having similar effects are the preparation of alkali metal carbonate salt with hydrochloric acid or the preparation of alkali metal bicarbonate salt with sodium hydroxide.

Nonionic surfactant of the formula (I) of the developer of the present invention preferably is the structure of the following formula.

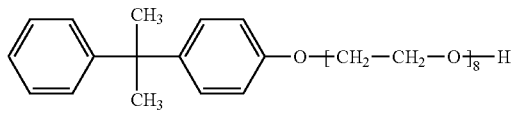

The said nonionic surfactant of the formula (II) preferably is the structure of the following formula.

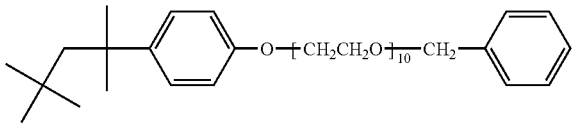

The developer of the present invention is suitable for the use with a photoresist composition comprising a colorant or a photoresist composition comprising an acrylic resin applied to a photoresist consisting of colorants.

DETAILED DESCRIPTION OF THE PREFERRED EMBODIMENTS

The components of the developer composition of the present invention can be purchased, and will not be further discussed herein.

The nonionic surfactants of the formula (I) and (II) of the developer composition of the present invention, wherein n and p are 0 to 10, m and q are 4 to 20 and more preferably 6 to 15, when m and q are less than 4 the solubility is insufficient causing the unwanted photoresist film to remain; when m and q are greater than 20 slight amount of surfactants remain on the photoresist film and decrease the physical properties of the obtained developed film.

The developer composition of the present invention comprises of the necessary components (a) alkali metal carbonate salt, (b) alkali metal bicarbonate salt, (c) nonionic surfactant of the general formula (I) below and (d) nonionic surfactant of the general formula (II) below, while rest of the components are the same as any typical photoresist developer. Furthermore, the developer of the present invention consisting of specific alkaline components and specific nonionic surfactants, with basic aqueous solution the pH is adjusted to 9–13 preferably, and more preferably 10–12.

When the said pH value is lowered to 9, under a low alkalinity there is a higher tendency for the formation of residual film, while the pH value is exceeded 13, under a high alkalinity the photoresist film tends to fall or strip off.

The amount of alkali metal carbonate salt and alkali metal bicarbonate salt are preferably 0.01 to 20 parts by weight, and more preferably 0.1 to 10 parts by weight by comparing with 100 parts by weight of water, and the obtained developer pH is 9–13.

The amount of nonionic surfactants of the formula (I) and (II) are preferably 0.01 to 25 parts by weight, and more preferably 0.1 to 20 parts by weight by comparing with 100 parts by weight of water. When the amount used is less than 0.01 parts by weight, the effect is insufficient and is more susceptible to the formation of residual film; when the said amount exceeded 25 parts by weight, solubility of alkaline matter tends to decrease and serious foaming and other problems is subjected to.

For adjusting the best pH value and other physical properties, the developer composition of the present invention is further added with other known alkaline compounds such as lithium, potassium, sodium, and other alkali metal hydroxides, bicarbonate, phosphate, borate, or ammonia and other inorganic alkaline compounds of like; tetramethylammonium hydroxide, 2-hydroxyethyl-N,N,N-trimethyl ammonium hydroxide, monomethyl amine, dimethylamine, trimethylamine, monoethyl amine, diethylamine, triethylamine, monoisopropyl amine, diisopropylamine, triisopropylamine, monoethanol amine, diethanolamine, triethanolamine, monoethanol dimethylamine, and other organic alkaline compounds of like.

The developer composition of the present invention, if necessary, surfactants such as other nonionic surfactants, anionic surfactants, cationic surfactants, amphoteric surfactants and polymeric surfactant may be further added to. The solubility and dispersion of the alkaline compounds will be enhanced; as well developing sensitivity can be adjusted with the use of the surfactants.

The aforementioned nonionic surfactants can be exemplified as polyoxyethylene alkyl ether, polyoxyethylene alkylphenyl ether, polyoxyethylene fatty acid ester, sorbitan fatty acid ester, polyoxyethylene sorbitan fatty acid ester, polyoxyethylene styrenated phenyl ether, polyoxyethylene distyrenated phenyl ether, polyoxyethylene tristyrenated phenyl ether, polyoxyethylene polyoxypropylene ether or condensation of polyoxyethylene fatty acid amide, amide and/or acid.

The aforementioned cationic surfactants can be exemplified as alkyl dimethyl benzyl quaternary ammonium salt, alkyl trimethyl quaternary ammonium salt, dialkyl dimethyl quaternary ammonium salt or picoline quaternary ammonium salt.

The aforementioned anionic surfactants can be exemplified as sodium lauryl sulfate, triethanolamine lauryl sulfate, dodecyl sodium polyoxyethylene ether sulphate, ammonium lauryl sulfate, dodecyl ammonium polyoxyethylene ether sulphate, alkyl benzene sulfonic acid or sodium dodecyl benzenesulfonate.

The aforementioned polymeric surfactant can be exemplified as polyvinyl alcohol, sodium poly(methyl)acrylate, potassium poly(meth)acrylate, ammonium poly(meth)acrylate, poly(meth)acrylic acetate, and other monomers or copolymer of other monomers or crosslinked polymer of like.

For the enhancement of solubility of alkaline compound in water or adjust development efficiency, fine water soluble organic solvents may be added as co-solvents, examples of are ethanol, isopropyl alcohol, butanol, hexanol, cyclohexanol, octanol, iso-nonanol, ethanediol, glycerol and other alcohols; ethylene glycol monoalkyl ether; diethylene glycol monoalkyl ether; diethylene glycol dialkyl ether; propylene glycol; polypropylene glycol monoalkyl ether acetate.

For transportation convenience the developer composition of the present invention can be used directly or used as a concentrate which requires to be diluted with 10 or 20 times by weight of ultra pure water, wherein a concentrate to be diluted with 10 time by weight of ultra pure water is preferable.

The developer of the present invention is suitable for the use with photosensitive resin comprising a colorant, the aforementioned photosensitive resin is not critical and may be positive or negative photosensitive resin composition, color photosensitive resin composition is restricted where often it comprises of organic or inorganic colorants, alkaline soluble binder, photosensitive compounds, solvents and other additives; examples of the aforementioned alkaline soluble binder resin are novolac resin, (meth)acrylic resin, maleic anhydride or polymeric half ester of it, polydydroxy styrene and others, wherein (meth)acrylic resin is preferred. Other possible examples are: methyl (meth)acrylate/hydroxyl phenol/styrene/(meth)acrylic acid polymer, benzyl methacrylate/meth)acrylic acid/styrene polymer, methyl (meth)acrylate/(meth)acrylic acid/polystyrene, methyl (meth)acrylate/benzyl (meth)acrylate/(meth)acrylic acid polymer.

Wherein molecular weight is ranging from 5,000–200,000, and more preferably 15,000–60,000.

The present invention will be explained descriptively with the following specific examples. It is to be understood that many other possible modifications and variations can be made without departing from the spirit and scope of the invention hereinafter claimed. Quantities are given in weight if there is no indication.

Preparation of the Colored Photoresist

To the alkaline-free glass substrate of the developed 90 nm by 230 nm black matrix pattern, colored photoresist is coated on top of, and then it is spin-coated for 20 seconds at 340 rpm. Finally, a uniform and thin film is formed.

Inside a clean oven setting at 90° C., the substrate is heated for 10 minutes to form a photoresist film of 2 μm in thickness.

Next, when the substrate is cooled to room temperature, a high pressure mercury vapor lamp is utilized. Through a line width of 90 μm photo mask, to the photoresist film, an energy of 100 mJ/cm² is exposed on top of.

Colored Photoresist Film Development

Parts by weight of alkaline compounds and nonionic surfactants as shown in table 1 are further added and mixed with 100 parts by weight of ultra pure water to prepare an aqueous solution which is the developer.

TABLE 1

Preparation of the Concentrate of the Developer Composition

| Developer Compositions | Na$_2$CO$_3$ | NaHCO$_3$ | Surfactant 1 | Surfactant 2 |
|---|---|---|---|---|
| Developer 1 | 1.55 | 0.6 | 3.5 | — |
| Developer 2 | 1.55 | 0.6 | 4.5 | — |
| Developer 3 | 1.55 | 0.6 | 3.5 | 1 |
| Developer 4 | 1.55 | 0.6 | — | 3.5 |

Surfactant 1

TABLE 1-continued

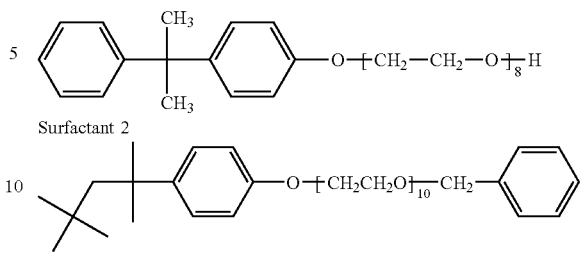

The developers 1 to 4 are obtained by diluting the aforementioned prepared concentrate of the developer composition from table 1 with ultra pure water for an aqueous solution having 10 times the weight of the concentrate. After, the substrate is immersed and agitated in the developer 1 to 4 aqueous solutions at 23° C. for 120 seconds, where then ultra pure water is washed with, then dried after.

The dried pattern is further proceeded with hard bake in an oven at 220° C. for 40 minutes.

The hard baked photoresist film is then analyzed with Scanning Electron Microscope (SEM) for residues degree of the unexposed region film, and the results obtained are shown below:

Developer 1: scum detected

Developer 2: scum detected

Developer 3: fine

Developer 4: scum detected.

As from the result of the aforementioned, developing feasibility of the conventional developer having a single nonionic surfactant is poor, as developing progresses scum accumulates, and resulting dissolved colorants or other water insoluble residues in the developing tank to sediment on top of the substrate or photoresist film. Particularly with the black matrix pattern created from black photoresist, it is more susceptible to scum in the unexposed region film after development, and may also include residues of resins and colorants. Flaws such as scum on color filter, surface contaminants and others are undesirable, but with the developer composition of the present invention the amount of scum on the substrate can surely be reduced.

Although the present invention has been explained in relation to its preferred embodiments, it is to be understood that many other possible modifications and variations can be made without departing from the scope of the invention as hereinafter claimed.

What is claimed is:

1. A developer composition comprising:
   (a) 0.1 to 10 parts by weight of alkali metal carbonate salt, the amount of said alkali metal carbonate salt is calculated by comparing with 100 parts by weight of water;
   (b) 0.1 to 10 parts by weight of alkali metal bicarbonate salt, the amount of said alkali metal bicarbonate salt is calculated by comparing with 100 parts by weight of water;
   (c) 0.1 to 20 parts by weight of nonionic surfactant of the formula (I) below:

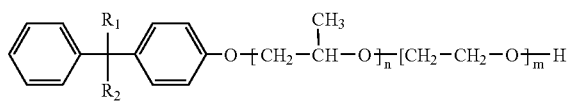

(I)

wherein $R_1$ is hydrogen or methyl; $R_2$ is hydrogen or methyl; n is an integer of 0 to 10; m is an integer of 4 to 20; the amount of said nonionic surfactant of the formula (I) is calculated by comparing with 100 parts by weight of water; and (d) 0.1 to 20 parts by weight of nonionic surfactant of the formula (II) below:

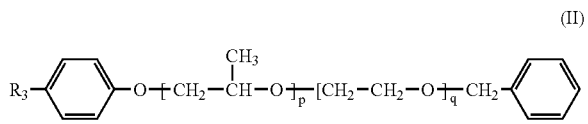

(II)

wherein $R_3$ is $C_1$–$C_{12}$ alkyl; p is an integer of 0 to 10; q is an integer of 4 to 20; the amount of said nonionic surfactant of the formula (II) is calculated by comparing with 100 parts or water.

2. The developer composition of claim 1, wherein said n of the formula (I) is an integer of 0 to 6; and said m of the formula (I) is an integer of 6 to 15.

3. The developer composition of claim 1, wherein said $R_3$ of the formula (II) is $C_6$–$C_{12}$ alkyl, said p of the formula (II) is 0, and said q of the formula (II) is an integer of 4 to 20.

4. The developer composition of claim 1, wherein aid $R_3$ of the formula (II) is $C_8$–$C_9$ alkyl.

5. The developer composition of claim 1, wherein said alkali metal carbonate salt is sodium carbonate or potassium carbonate.

6. The developer composition of claim 1, wherein said alkali metal bicarbonate salt is sodium bicarbonate or potassium bicarbonate.

7. The developer composition of claim 1, wherein said alkali metal carbonate salt is sodium carbonate, said alkali metal bicarbonate salt is bicarbonate, said nonionic surfactant of the formula (I) is the following compound:

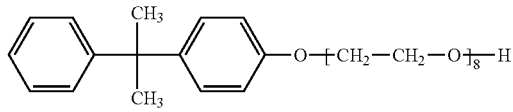

and said nonionic surfactant of the formula (II) is the following compound:

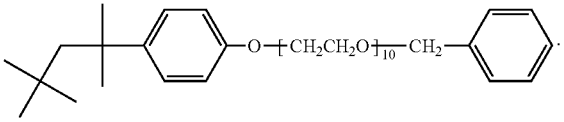

8. The developer composition of claim 1, wherein said developer composition is suitable for the use with a photoresist composition comprising a colorant.

9. The developer composition of claim 1, wherein said developer composition is suitable for the use with a photoresist composition comprising an (meth)acrylic resin.

* * * * *